United States Patent
Naaman et al.

(10) Patent No.: US 9,461,588 B1
(45) Date of Patent: Oct. 4, 2016

(54) DOUBLY BALANCED JOSEPHSON JUNCTION MIXER

(71) Applicant: MICROSOFT TECHNOLOGY LICENSING, LLC, Redmond, WA (US)

(72) Inventors: Ofer Naaman, Ellicott City, MD (US); Joshua Allan Strong, Columbia, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/734,454

(22) Filed: Jun. 9, 2015

(51) Int. Cl.
  G06G 7/12 (2006.01)
  H03D 9/06 (2006.01)
  H03K 3/38 (2006.01)

(52) U.S. Cl.
  CPC . *H03D 9/06* (2013.01); *H03K 3/38* (2013.01)

(58) Field of Classification Search
  USPC .......................... 327/355; 455/307, 317, 325
  See application file for complete search history.

(56) References Cited

U.S. PATENT DOCUMENTS

| | | | |
|---|---|---|---|
| 4,496,854 A | 1/1985 | Chi et al. | |
| 5,280,649 A | 1/1994 | Riebman | |
| 5,334,884 A | 8/1994 | Tesche | |
| 5,530,927 A * | 6/1996 | Smith | H03D 9/06 333/99 S |
| 5,790,078 A * | 8/1998 | Suzuki | H01Q 1/247 29/600 |
| 5,869,846 A * | 2/1999 | Higashino | H01L 39/228 257/31 |
| 6,448,767 B1 | 9/2002 | Ganther, Jr. et al. | |
| 6,744,308 B1 * | 6/2004 | Beumer | H03F 3/45085 327/563 |
| 8,275,338 B2 * | 9/2012 | Papananos | H03D 7/1458 455/296 |
| 8,331,896 B2 * | 12/2012 | Papananos | H03D 7/1458 455/296 |
| 8,744,541 B1 | 6/2014 | Filippov et al. | |
| 8,928,391 B2 | 1/2015 | Naaman et al. | |
| 2004/0043740 A1 * | 3/2004 | Magnusen | H03D 7/165 455/307 |
| 2004/0185802 A1 * | 9/2004 | Fukui | H03D 7/005 455/104 |

(Continued)

FOREIGN PATENT DOCUMENTS

WO    03034542 A1    4/2003

OTHER PUBLICATIONS

Bin, et al., "Low-noise 1 THz Niobium Superconducting Tunnel Junction Mixer with a Normal Metal Tuning Circuit", In Journal of Applied Physics Letters, vol. 68, Issue 12, Mar. 18, 1996, pp. 1714-1716.

(Continued)

*Primary Examiner* — Adam Houston
(74) *Attorney, Agent, or Firm* — Steve Wight; Sergey Lamansky; Micky Minhas

(57) ABSTRACT

Embodiments are directed to doubly balanced superconducting mixers and to methods for modulating a radio frequency signal using multiple tunable inductive elements in a doubly balanced superconducting mixer. In one scenario, a doubly balanced superconducting mixer is provided which includes an input port that receives an signal. The doubly balanced superconducting mixer further includes an IF control signal, a DC control signal and a filter that includes a first inner filter stage and a second inner filter stage. The first and second inner stages are coupled via a ring of tunable inductive elements, and are further inductively coupled to outer filter stages. The doubly balanced superconducting mixer further includes a controller that modulates the RF signal using the IF control signal and the DC control signal to tune the ring of tunable inductive elements to control transmission of the RF signal through the first and second inner filter stages.

20 Claims, 9 Drawing Sheets

(56) References Cited

U.S. PATENT DOCUMENTS

| | | | | |
|---|---|---|---|---|
| 2008/0238751 | A1* | 10/2008 | Volnhals | H04B 1/28 341/155 |
| 2015/0111754 | A1* | 4/2015 | Harris | G06N 99/002 505/170 |
| 2016/0087599 | A1* | 3/2016 | Naaman | H03H 7/20 333/139 |

OTHER PUBLICATIONS

Herr, et al., "Ultra-Low-Power Superconductor Logic", In Journal of Applied Physics, vol. 109, May 17, 2011, pp. 1-7.

Ronzani, et al., "Balanced Double-Loop Mesoscopic Interferometer based on Josephson Proximity Nanojunctions", In Journal of Applied Physics Letters, vol. 104, Issue 3, Jan. 2014, pp. 1-5.

Kooi, et al., "Performance of the Caltech Submillimeter Observatory Dual-Color 180-720 GHz Balanced SIS Receivers", In Proceedings of IEEE Transactions on Terahertz Science and Technology, vol. 4, Issue 2, Feb. 19, 2014, pp. 1-16.

Kooi, et al., "Balanced Receiver Development for the Caltech Submillimeter Observatory", In Proceedings of 22nd International Symposium on Space Terahertz Technology, vol. 2, Issue 1, Apr. 26, 2011, pp. 1-12.

Caputo, et al., "Quadratic Mixing of Radio Frequency Signals using Superconducting Quantum Interference Filters", In Journal of Applied Physics Letters, vol. 89, Aug. 9, 2006, pp. 1-4.

Hornibrook, et al., "Cryogenic Control Architecture for Large-Scale Quantum Computing", arXiv:1409.2202v1 [cond-mat.mes-hall] Sep. 8, 2014 (8 pages) http:/ arxiv.org/pdf/1409.2202.pdf.

* cited by examiner

DOUBLY BALANCED JOSEPHSON JUNCTION MIXER

BACKGROUND

Doubly balanced mixers are often used in microwave applications. These mixers are typically built using diodes or other semi-conducting devices. Superconducting mixers, however, are much less common. Superconducting mixers are designed to operate at very low temperatures. In some cases, these temperatures may reach below one Kelvin.

BRIEF SUMMARY

Embodiments described herein are directed to doubly balanced superconducting mixers and to methods for modulating a radio frequency (RF) signal using multiple tunable inductive elements in a doubly balanced superconducting mixer. In one embodiment, a doubly balanced superconducting mixer is provided which includes an input port configured to receive as an input an RF signal. The doubly balanced superconducting mixer further includes an intermediate frequency (IF) control signal, a direct current (DC) control signal and a filter that includes a first inner filter stage and a second inner filter stage. The first and second inner stages are coupled via a ring of tunable inductive elements. The first and second inner filter stages are also inductively coupled to outer filter stages, the whole forming a balanced band-pass filter. The doubly balanced superconducting mixer further includes a controller that modulates the RF signal using the IF control signal and the DC control signal to tune the ring of tunable inductive elements control transmission of the RF signal through the filter.

In another embodiment, a method is provided for modulating an RF signal using multiple tunable inductive elements in a doubly balanced superconducting mixer. The method includes receiving, at an input port, an RF signal, receiving an IF control signal, receiving a DC control signal, and modulating the received RF signal using the IF control signal and the DC control signal to switch the ring of tunable inductive elements to allow or prevent transmission of the RF signal through a filter. The filter includes a ring of tunable inductive elements that mediate the coupling between the inner stages. The inner filter stages are also inductively coupled to multiple outer filter stages, such that they form a balanced filter.

In another embodiment, a doubly balanced superconducting mixer is provided which includes the following: an input port configured to receive as an input an RF signal, an IF control signal, a DC control signal, a band-pass filter that includes inner filter stages, coupled via a ring of tunable Josephson, where the inner filter stages are also inductively coupled to multiple outer filter stages, to form a balanced band-pass filter, and a controller that modulates the RF signal using the IF control signal and the DC control signal to tune the ring of tunable Josephson junctions to control transmission of the RF signal through the band-pass filter. In this manner, a doubly balanced superconducting mixer is provided which can perform signal processing in superconducting microwave circuits. Such a doubly balanced, superconducting mixer may have little to no dissipation, and may be applied in many different scenarios including quantum computing (specifically in qubit control and readout), in analog front-end for digital receivers that use reciprocal quantum logic (RQL), and other microwave superconducting applications such as detectors for astronomy research and satellite communications.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Additional features and advantages will be set forth in the description which follows, and in part will be apparent to one of ordinary skill in the art from the description, or may be learned by the practice of the teachings herein. Features and advantages of embodiments described herein may be realized and obtained by means of the instruments and combinations particularly pointed out in the appended claims. Features of the embodiments described herein will become more fully apparent from the following description and appended claims.

BRIEF DESCRIPTION OF THE DRAWINGS

To further clarify the above and other features of the embodiments described herein, a more particular description will be rendered by reference to the appended drawings. It is appreciated that these drawings depict only examples of the embodiments described herein and are therefore not to be considered limiting of its scope. The embodiments will be described and explained with additional specificity and detail through the use of the accompanying drawings in which.

DETAILED DESCRIPTION

Figure 1:
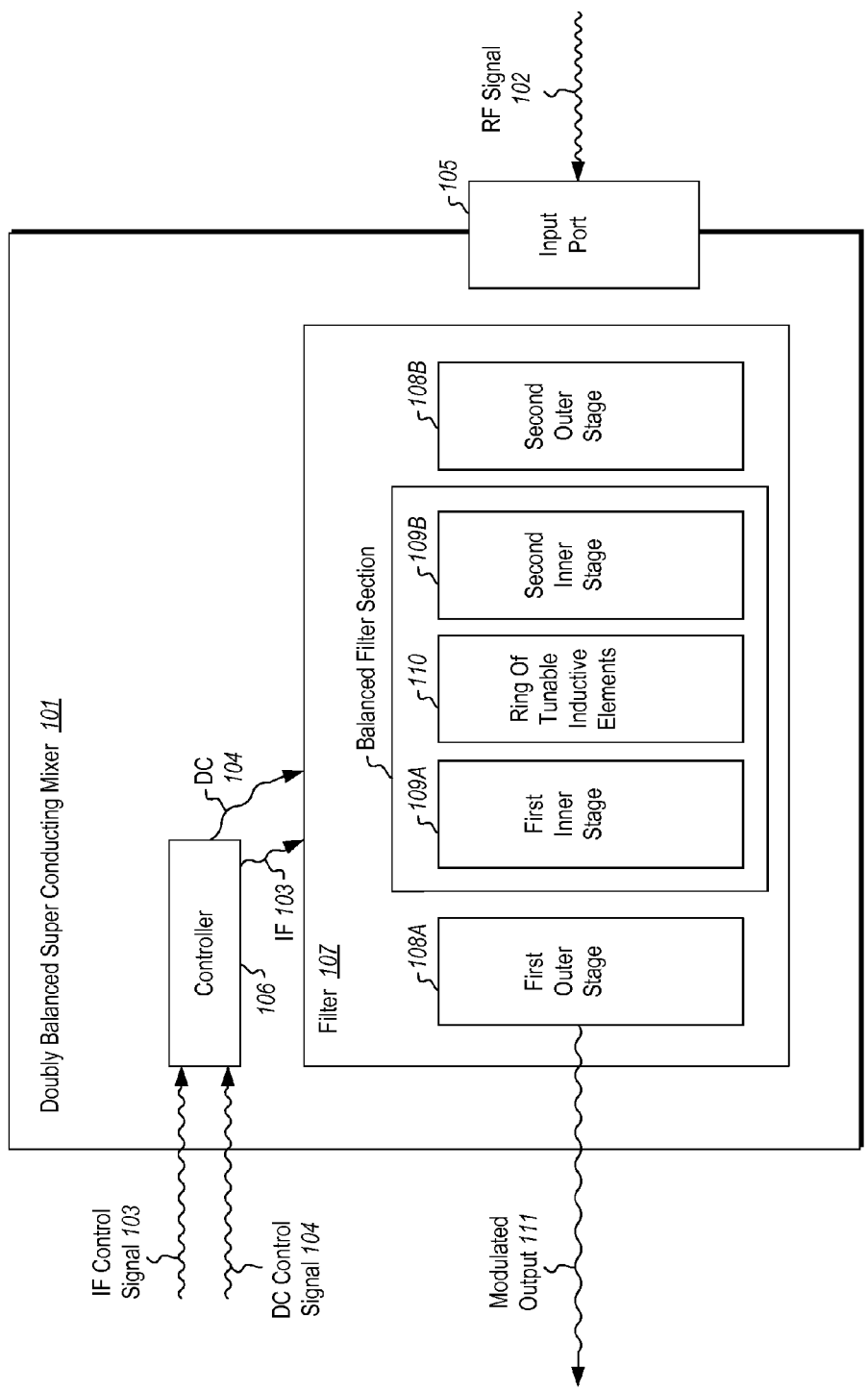
FIG. 1 illustrates an embodiment of a doubly balanced superconducting mixer.

Embodiments described herein are directed to doubly balanced superconducting mixers and to methods for modulating an RF signal using multiple tunable inductive elements in a doubly balanced superconducting mixer. In one embodiment, a doubly balanced superconducting mixer is provided which includes an input port configured to receive as an input an RF signal. The doubly balanced superconducting mixer further includes an IF control signal, a DC control signal and a filter that includes a first inner filter stage and a second inner filter stage.

The inner stages are coupled via a ring of tunable inductive elements. The inner filter stages are also inductively coupled to outer filter stages, to form a balanced filter. The doubly balanced superconducting mixer further includes a controller that modulates the RF signal using the IF control signal and the DC control signal to tune the ring of tunable inductive elements to control transmission of the RF signal through the filter.

In another embodiment, a method is provided for modulating an RF signal using multiple tunable inductive elements in a doubly balanced superconducting mixer. The method includes receiving, at an input port, an RF signal, receiving an IF control signal, receiving a DC control signal, and modulating the received RF signal using the IF control signal and the DC control signal to tune the ring of tunable inductive elements to control transmission of the RF signal through a filter. The filter includes a ring of tunable inductive elements that mediate the coupling between the inner filter stages. The inner filter stages are also inductively coupled to multiple outer filter stages, to form a balanced filter.

In another embodiment, a doubly balanced superconducting mixer is provided which includes the following: an input port configured to receive as an input an RF signal, an IF control signal, a DC control signal, a band-pass filter that includes a first inner filter stage and a second inner filter stage, coupled via a ring of Josephson junctions that mediates the coupling between the inner filter stages, where the inner filter stages are also inductively coupled to multiple outer filter stages, to form a balanced band-pass filter section, and a controller that modulates the RF signal using the IF control signal and the DC control signal to tune the ring of tunable Josephson junctions to control transmission of the RF signal through the band-pass filter.

The following discussion now refers to a number of systems, methods and method acts that may be performed. It should be noted, that although the method acts may be discussed in a certain order or illustrated in a flow chart as occurring in a particular order, no particular ordering is necessarily required unless specifically stated, or required because an act is dependent on another act being completed prior to the act being performed.

Embodiments described herein may implement various types of computing systems. For example, a computing system that includes a controller or processor may be used to perform methods for modulating an RF signal using multiple tunable inductive elements in a doubly balanced superconducting mixer. These computing systems may take a wide variety of forms. Computing systems may, for example, be communicatively linked to or may include handheld devices such as smartphones or feature phones, appliances, laptop computers, wearable devices, desktop computers, mainframes, distributed computing systems, or even devices that have not conventionally been considered a computing system.

In this description and in the claims, the term "computing system" is defined broadly as including any device or system (or combination thereof) that includes at least one physical and tangible hardware processor, and a physical and tangible hardware or firmware memory capable of having thereon computer-executable instructions that may be executed by the processor. A computing system may be distributed over a network environment and may include multiple constituent computing systems. Controllers or other electronic hardware may include digital or analog components, or may include combinations thereof. In some embodiments, controllers for IF or DC control signals may be digital controllers, while in other embodiments, analog generators may be used to generate IF and DC control signals.

FIG. 1 illustrates an embodiment of a doubly balanced superconducting mixer 101. The doubly balanced superconducting mixer 101 includes an input port 105 configured to receive input signals. These input signals may be any type of radio frequency (RF) signal at substantially any frequency. The input signals received at the input port 105 may be modulated according to amplitude, frequency or phase. The input port 105 may be configured to receive the signals and pass them on to other components within the doubly balanced superconducting mixer 101. For instance, the input port 105 may be configured to pass the RF signal 102 on to the filter 107 and/or other components. The input port 105 may receive many different signals sequentially or simultaneously, and each signal may be routed to the same component or to different components. In some cases, the input port 105 may be part of or may itself be a receiver. The receiver may include other components or processes including signal conditioning, demodulation and others.

The doubly balanced superconducting mixer 101 of FIG. 1 also includes a controller 106. The controller may be any type of analog or digital hardware that controls the functionality of an electronic component. For example, the controller 106 may control or generate incoming signals such as intermediate frequency (IF) control signal 103 and direct current (DC) control signal 104. Both the IF control signal 103 and the DC control signal 104 may provide currents that dictate when various electronic elements within the filter 107 are to prevent or allow the passing of a signal. In some embodiments, the DC control signal 104 may be fed into the first outer stage 108A of the filter 107 and the IF control signal 103 may be fed into the second outer stage 108B of the filter 107. These may be switched in other embodiments.

The filter 107 of the doubly balanced superconducting mixer 101 also includes a first inner filter stage 109A and a second inner filter stage 109B. These two inner stages are coupled via a ring of tunable inductive elements 110. This is shown in greater detail in FIG. 2A, as will be described below. The ring of tunable inductive elements 110 may comprise any of a variety of different inductive elements. The ring 110 may include inductive elements of the same type or inductive elements of different types.

For example, as used herein, an "inductive element" or "inductor" may refer to any type of electrical component that is designed to resist changes in electric current passing through it. Inductors are typically made of conductors such as a wire wound into a coil. The amount that these inductors resist changes in current referred to as inductance. The inductance of a tunable inductive element may be changed by applying a control current. A controller may allow more or less control current to reach the tunable inductor, thereby changing its inductance. The tunable inductance may allow or prevent a signal from flowing through a filter. In this manner, a tunable inductive element may be controlled by a controller. The controller itself may be any type of analog or digital hardware configured to generate a control signal. This control signal may, for example, be used to modulate an input RF signal.

Figure 2A:
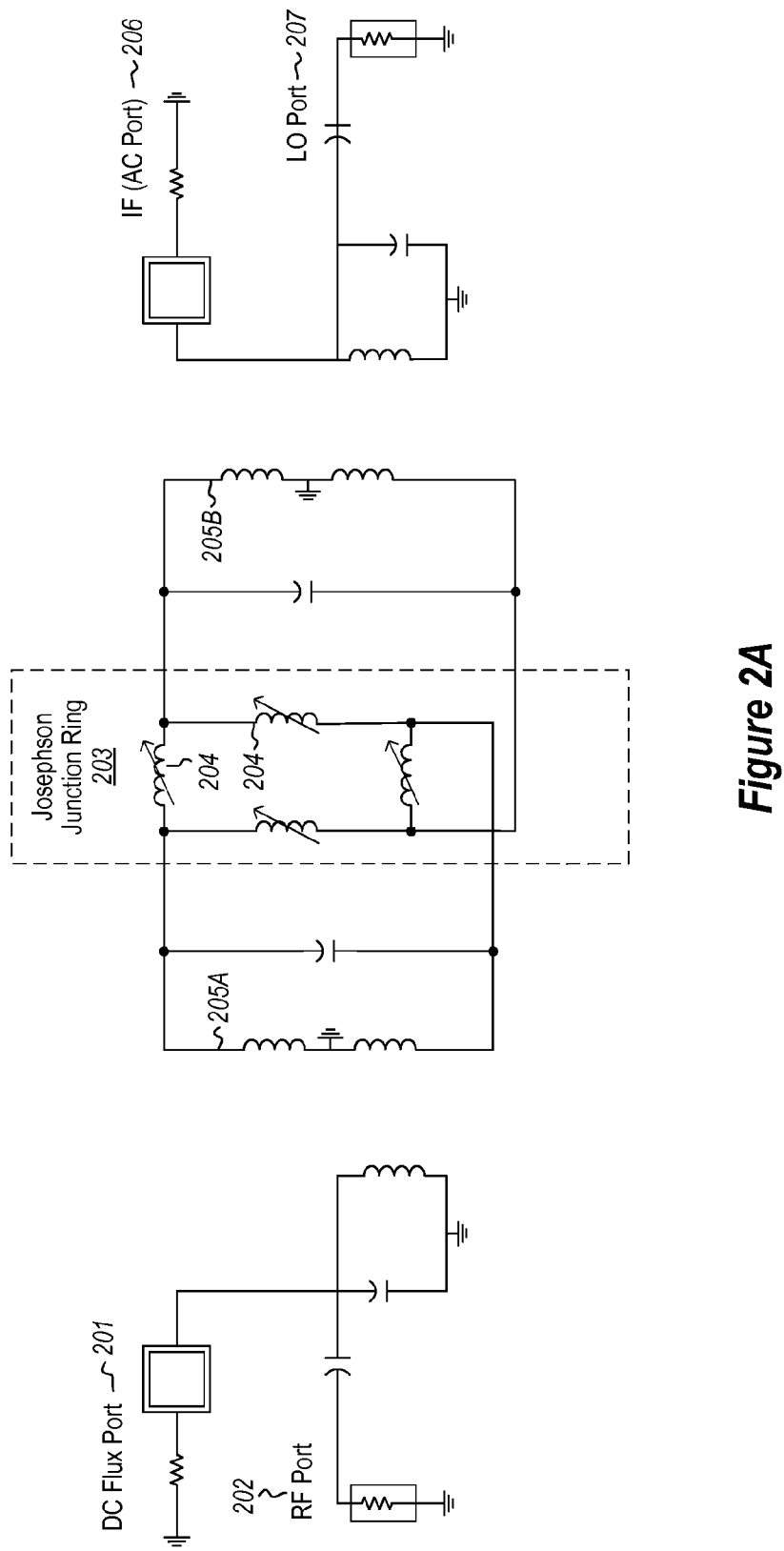
FIGS. 2A-2C illustrate embodiments of balanced modulators using Josephson junctions.

In some cases, as described herein, multiple inductive elements may be connected together to form a ring of tunable inductive elements. For instance, as shown in FIG. 2A, four tunable inductive elements may be electrically connected together to form a ring. This ring of tunable elements may include Josephson junctions. Josephson junctions include two superconductors coupled together via an insulating barrier. The materials used in Josephson junctions allow them to conduct electricity with almost no resistance when operated at temperatures approaching absolute zero. Because the Josephson junctions are tunable inductive elements, they may be used to allow or prevent a signal from flowing through a filter. As such, their inductance may be tuned by a controller to modulate, demodulate or perform other operations on a signal.

The ring 110 may be positioned such that it separates the first inner stage 109A from the second inner stage 109B. The ring of tunable inductive elements 110 may be designed to respond to control signals such as IF control signal 103 and DC controls signal 104. The response may include allowing or preventing signal flow between the second inner stage 109B and the first inner stage 109A. Thus, as an RF signal comes in as input, the flow of that RF signal (e.g. 102) through the filter 107 may be controlled by the ring of tunable inductive elements 110. The flow of the RF signal may be transmitted or rejected in a controllable manner, thus enabling modulation (or demodulation) of the RF signal. This modulation is controlled by the controller 106. The modulated RF output signal 111 may be sent to another electronic component or to another entity.

Figure 2B:
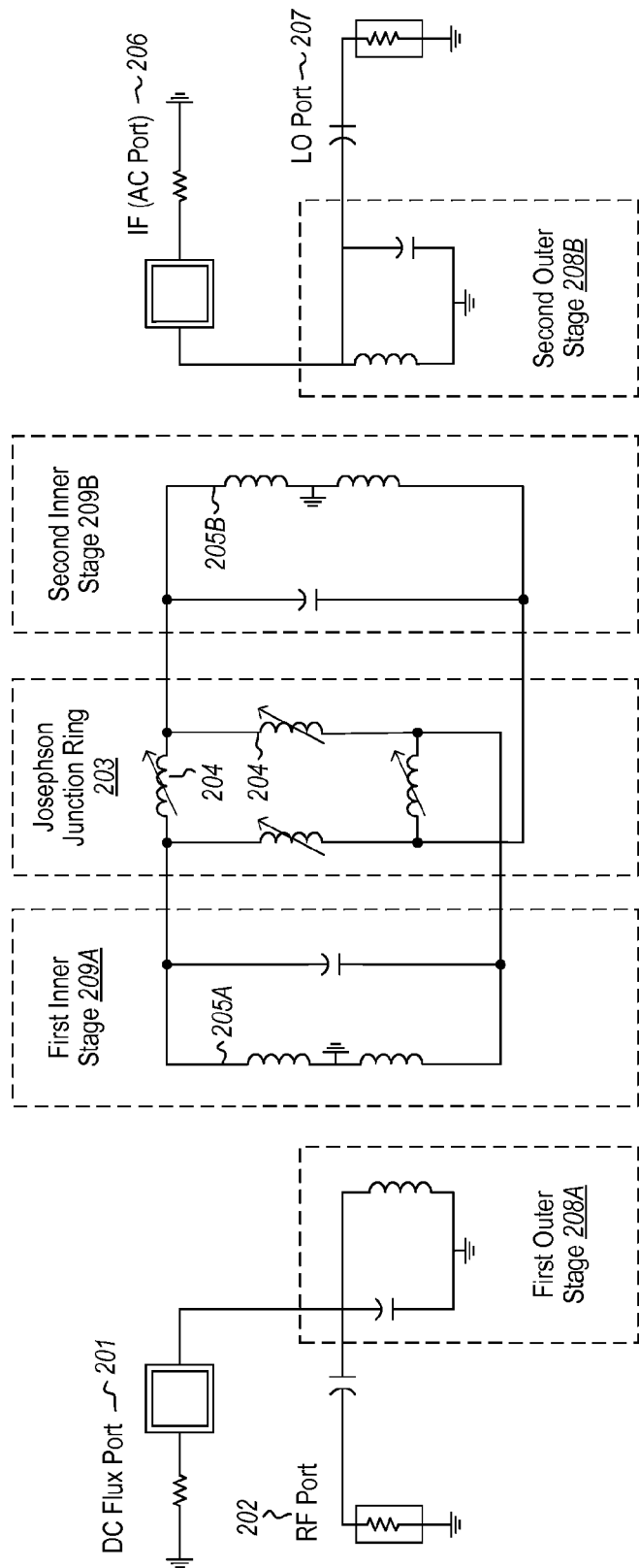

FIG. 2 illustrates one example of a doubly balanced superconducting mixer. It will be understood that the doubly balanced superconducting mixers described herein (including doubly balanced superconducting mixer 101 of FIG. 1) may include different types of filters including the four-pole Chebychev band-pass filter shown in FIG. 2A, but also substantially any other type of filter with different numbers of poles. Indeed, different types of filters may be used to provide different filtering characteristics. The mixer 200 of FIG. 2A includes an IF (AC port) 201 that provides an alternating current signal. The mixer 200 further includes an LO input port 207 that receives input RF signals and passes them to the inner parts of the filter. As shown in FIG. 2B, the IF port 201 and the LO port 207 may be part of the second outer stage 208B, corresponding to the second outer stage 108B of FIG. 1.

The doubly balanced superconducting mixer 200 of FIG. 2A may further include inductors 205A and 205B and capacitors or other components. These components may be part of the first and second inner stage 209A and 209B of the filter 200. These components may be inductively coupled to the first and second outer stages 208A and 208B to allow signal transmission between the components. The doubly balanced superconducting mixer 200 further includes a ring of tunable inductive elements which, as shown in FIGS. 2A and 2B, may be Josephson junctions 203. These Josephson junctions may have low insertion loss, low temperature operation, very low (or zero) internal resistance, and may have other desirable characteristics. That said, any type of tunable inductive element may be used in the embodiments described herein.

The Josephson junctions' inductance may be tunable based on control currents flowing through them (e.g. control currents 201 and 206). The tunable inductance may allow or prevent a signal from flowing through the filter. The operation of this flow will be described further below with regard to FIG. 3. In cases where the control currents 201 and 206 allow the flow of the RF signal through the components of the two inner filter stages 209A and 209B, the RF signal 202 may be output in a modulated fashion. Indeed, the control signals 201/206 that tune the inductance of the Josephson junctions may be controlled by a controller (e.g. 106 of FIG. 1).

Figure 2C:
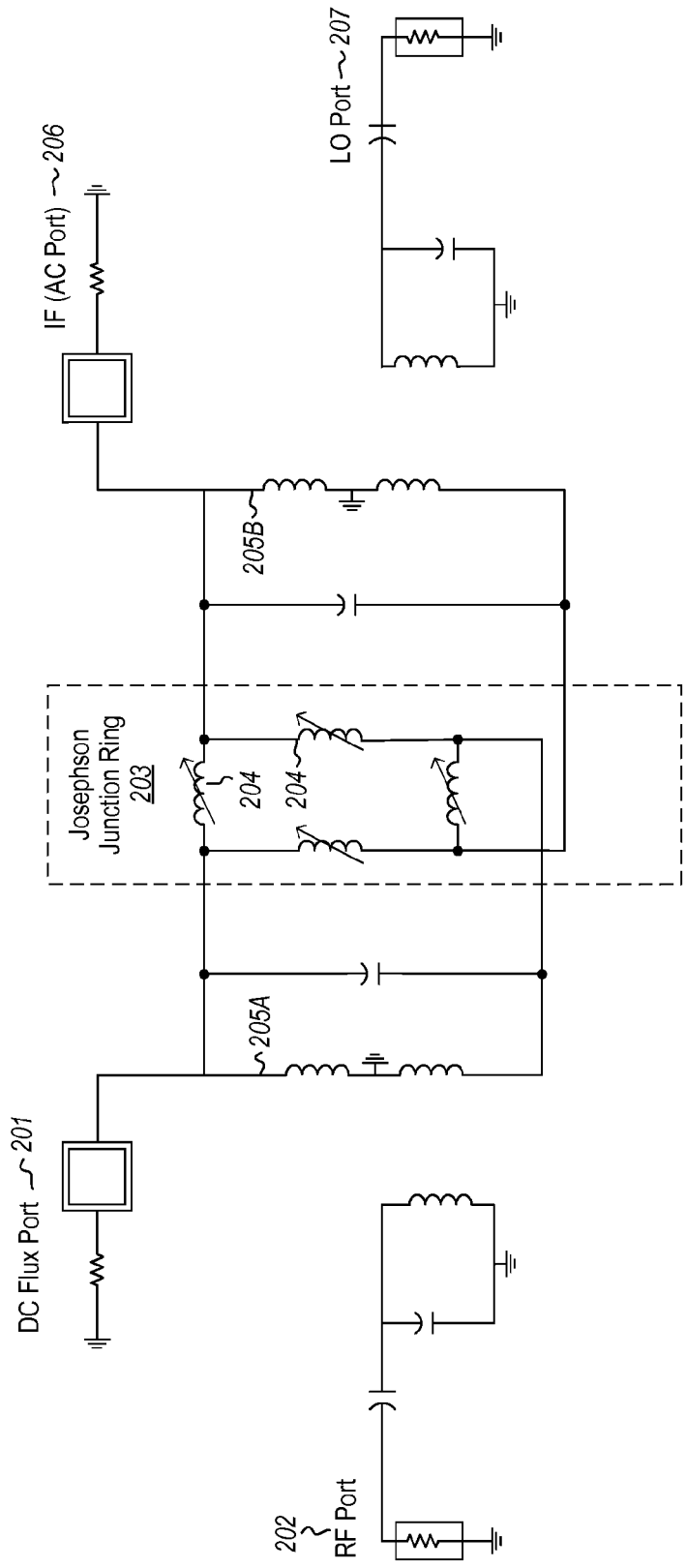
Figure 3:
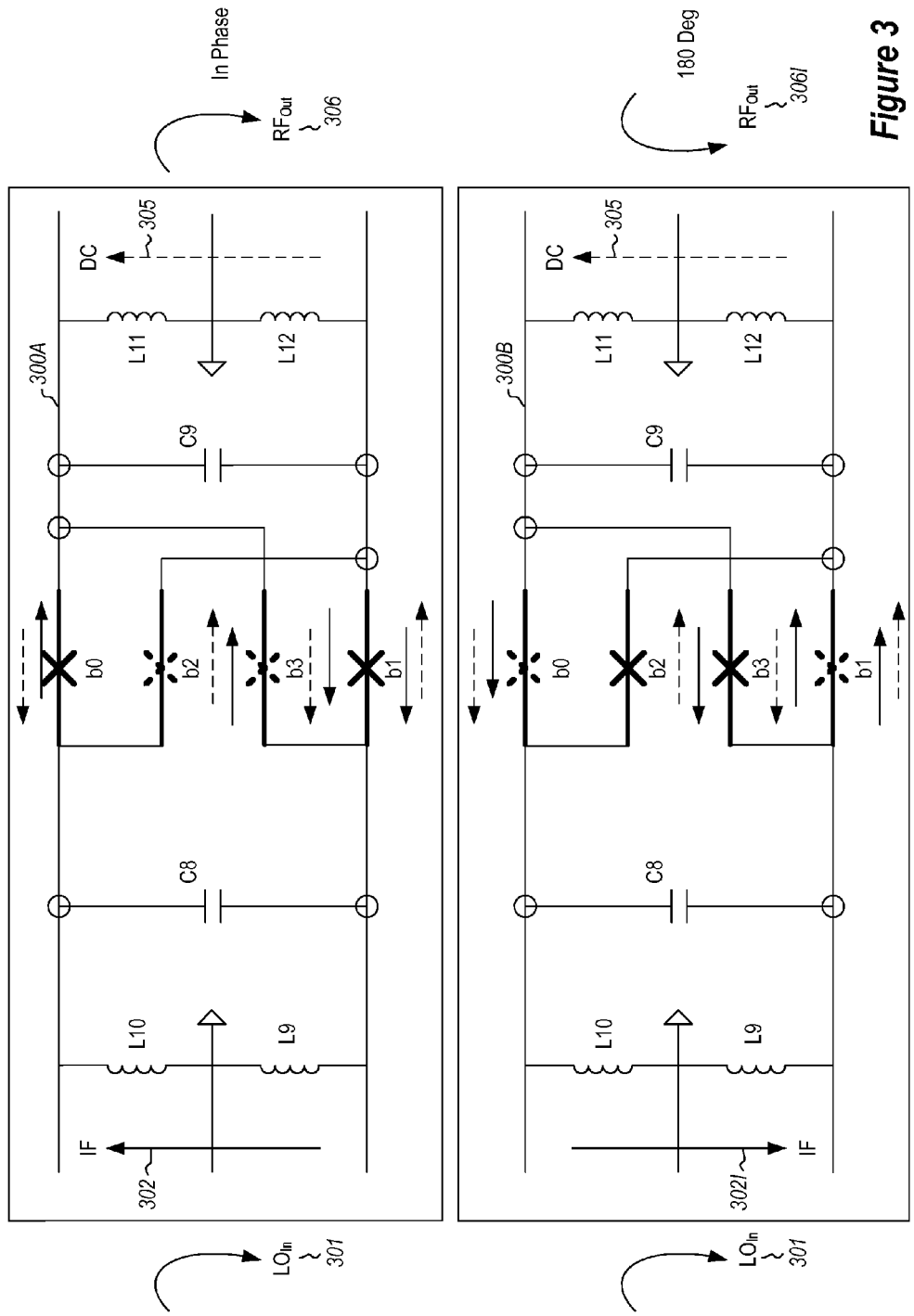
FIG. 3 illustrates two embodiments of modulation by applying a DC and an IF bias.

Figure three illustrates an embodiment in which an RF input signal may be received at the circuit (300A or 300B, respectively). The circuits 300A and 300B may include the same components, but may receive a periodic signal (e.g. an alternating current). As such, circuit 300A may represent one instance of time, and circuit 300B may represent a second instance in time, half a period later. The RF signal may, for example, be received as shown in the second outer stage 208B of FIG. 2B. The circuit portions shown in FIG. 3 may comprise the first and second inner stages 209A and 209B of FIG. 2. In the upper circuit 300A of FIG. 3, the RF input signal is received at a time when the IF control signal 302 and the DC input signal 305 are both on and both induce currents having the same polarity with respect to the inductors of the inner filter stages. As shown in FIG. 3, the control currents add on junctions b2 and b3 but cancel on junctions b0 and b1, resulting in junctions b2 and b3 having a high inductance and junctions b0 and b1 having low inductance. Therefore, the RF input signal flows through Josephson junctions b0 and b1, but does not flow through junctions b2 or b3.

As illustrated in circuit 300A FIG. 3, two of the Josephson junctions prevent the flow of the RF signal (b2 and b3) (as indicated by dotted-line X's), while the other two (b0 and b1) junctions allow flow of the RF signal (as indicated by solid-line X's). This is due to the presence of the IF and DC input currents 302 and 305. As can be seen by the solid and dotted line arrows shown at each Josephson junction, the flow of the control signal current may be different at each junction. In FIG. 3, the solid lines and arrows show the flow of the IF input current 302, while the dotted lines and arrows show the flow of the DC input current 305. Thus, at moments in time where the IF and DC control currents are both turned on and have the same polarity as indicated in 300A, the flows of the control currents 302 and 305 either add to each other and prevent flow of the RF signal (as at junctions b2 and b3), or cancel each other out and allow flow of the RF signal.

Thus, at Josephson junctions where the control currents cancel each other out (b0 and b1), the Josephson junctions are tuned such that they couple together the filter components of the inner two stages (209A and 209B), and the RF signal is permitted to flow through the circuit 300A. Conversely, at Josephson junctions where the control currents add to each other (b2 and b3), the Josephson junctions are tuned such that they inhibit coupling of the filter components of the inner two stages (209A and 209B), and the RF signal is prevented from flowing through the circuit 300A. When either the DC or IF current is zero, or when the net control currents flowing through the junctions are equal, the ring of Josephson junctions is balanced and the transmission through the filter is zero. When the DC current applies a flux equal to that applied by the IF current, the circuit gives full transmission over the filter's pass band. If the IF current is equal and opposite to that of the DC control signal, then the circuit also gives full transmission, but with a 180 degree phase shift, as is shown in circuit 300B.

In the case of 300B, the control currents 302 and 305 add to each other at Josephson junctions b0 and b1 (as indicated by the solid and dotted-line arrows above and below the junctions, thereby tuning the Josephson junction such that it inhibits coupling of the filter components of the inner two stages (209A and 209B), and the RF signal is prevented from flowing through the circuit 300B at those junctions. Similarly, at Josephson junctions where the control currents cancel each other out (b2 and b3), the Josephson junctions are tuned such that they couple together the filter components of the inner two stages (209A and 209B), and the RF signal is permitted to flow through the circuit 300B. Thus the circuit gives full transmission over the filter's pass band, and the input signal appears at the output with a 180 degrees phase shift.

Figure 4:
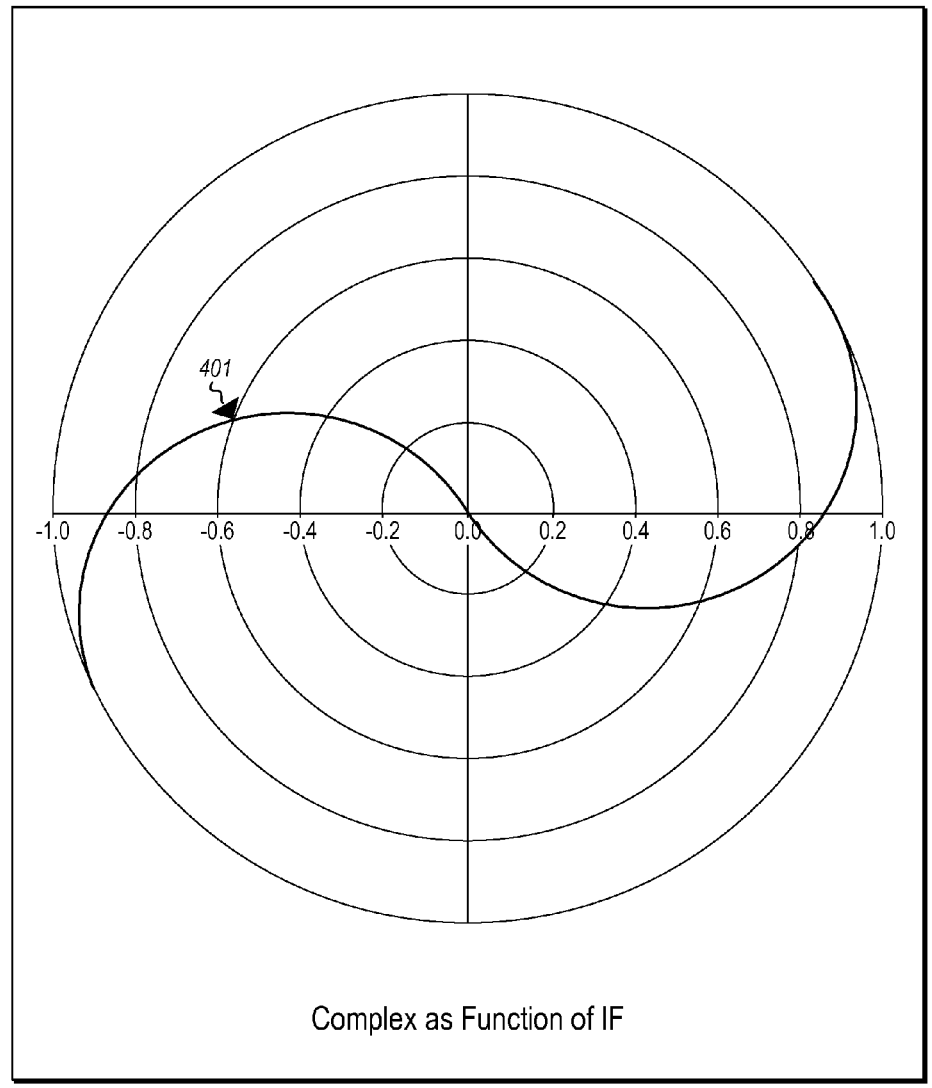
FIG. 4 illustrates an illustration of a complex plane for transmission of an input signal.

As illustrated in FIG. 4, a complex plane picture of the transmission through the mixer 401 is provided. The complex plane picture shows real part of the transmission on the x-axis and imaginary part of the transmission on the y-axis. The complex plane's depiction of the transmission 401 illustrates how the balanced modulator of FIG. 2A or FIG. 3 operate. On the right side of the complex plane, the magnitude of the transmission goes up to 1.0, where the entire signal is coming through at 30 or so degrees with respect to the input. This position illustrates a scenario where the DC and IF control signals are both on and have the same polarity.

If the amplitudes of the DC and IF currents are such that equal net current flows through the junctions, no net RF signal is permitted to flow through the Josephson junctions, as shown in the middle of the complex plane. In this configuration, half of the signal goes through b0 and b1, and the other half goes through b2 and b3. Because the two parts of the signal are 180 degrees out of phase, they cancel each other and no net output is delivered to the outer stage.

Figure 5:
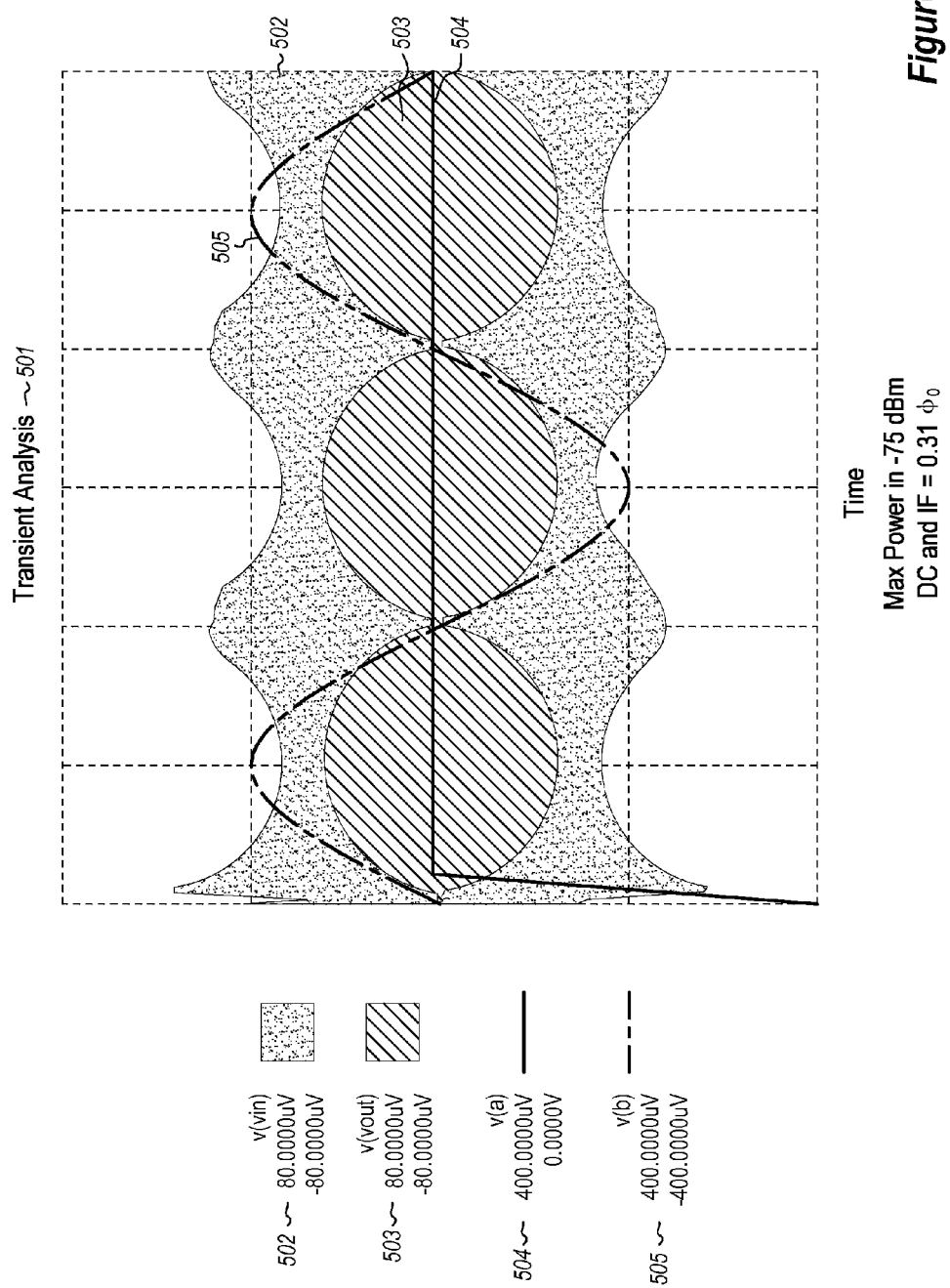
FIG. 5 illustrates a transient analysis of a simulation where inputs and outputs change as DC and IF control signals are applied.

If the DC and IF control signals are both on, but have opposite polarity, the Josephson junctions allow the RF signal to flow through, but the polarity is reversed, as is shown by the transmission 401 on the left of FIG. 4, having magnitude of 1.0, and a phase of 210 degrees for a total of 180 degrees shift in phase FIG. 5 is an example of a simulation where a transient analysis shows inputs and outputs as DC control (504) and IF control (505) signals are applied. The trace Vin 502 shows the envelope of the voltage at the input port, which includes the input signal plus reflections, while the trace Vout 503 shows the envelope of the output signal. The trace Vout 503 is modulated to be on and off, and may be further changed to be in-phase or out-of-phase. When Vout goes to zero, the incoming signal is reflected at the input port, as evident by an increase in Vin. These concepts, as well as those discussed above, will be explained further below with regard to methods 700 of FIG. 7.

Figure 7:
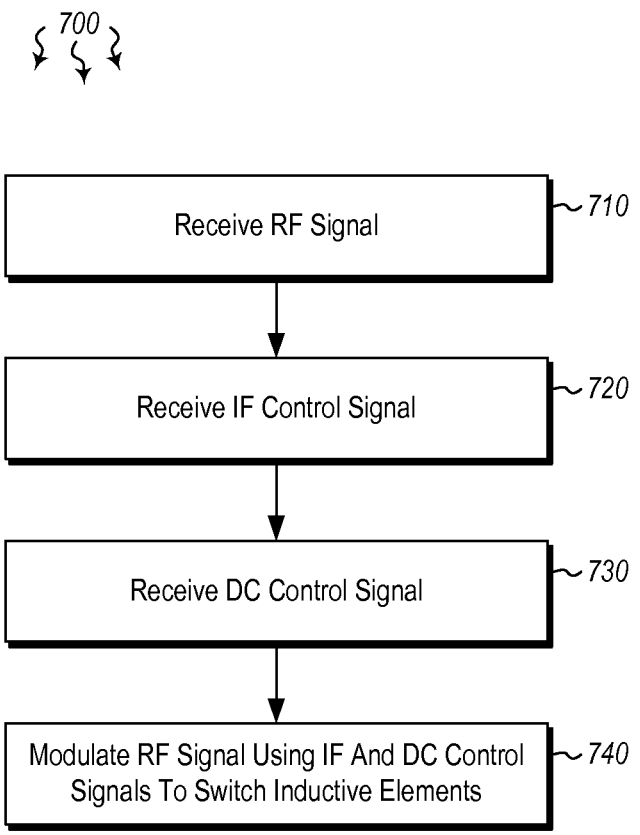
FIG. 7 illustrates a flowchart of an example method for modulating an RF signal using multiple tunable inductive elements in a doubly balanced superconducting mixer.

In view of the systems and architectures described above, methodologies that may be implemented in accordance with the disclosed subject matter will be better appreciated with reference to the flow charts of FIG. 7. For purposes of simplicity of explanation, the methodologies are shown and described as a series of blocks. However, it should be understood and appreciated that the claimed subject matter is not limited by the order of the blocks, as some blocks may occur in different orders and/or concurrently with other blocks from what is depicted and described herein. Moreover, not all illustrated blocks may be required to implement the methodologies described hereinafter.

FIG. 7 illustrates a flowchart of a method 700 for modulating a radio frequency (RF) signal using a plurality of tunable inductive elements in a doubly balanced superconducting mixer. The method 700 will now be described with frequent reference to the components and data of environment 100 of FIG. 1, FIG. 2, FIG. 3, and environment 600 of FIG. 6.

Method 700 includes receiving, at an input port, an RF signal (710). For example, RF signal 102 may be received at input port 105 of doubly balanced superconducting mixer 101. Method 700 further includes receiving an IF control signal (720) and receiving a DC control signal (730). The controller 106 of doubly balanced superconducting mixer 101 may receive IF control signal 103 and DC control signal 104 from IF and DC control signal generators, respectively. These IF and DC control signal generators may generate the signals in response to the controller, or may provide IF and DC signals that are then controlled by the controller 106. The controller 106 may be configured to control the IF and DC signals in such a manner that they tune the inductance of the Josephson junctions to allow or prevent transmission of the RF input signal 102.

Method 700 further includes modulating the received RF signal using the IF control signal 103 and the DC control signal 104 to tune the ring of tunable inductive elements 110 to control transmission of the RF signal 102 through first and second inner filter stages of a filter (340). The ring of tunable elements 110 may allow continuous control of the transmission of the RF signal from fully on to partly on, to off, or to on and negative. The filter 107 includes a ring of tunable inductive elements 110 that mediate the coupling between the first inner filter stage 109A and the second inner filter stage 109B. The first and second inner filter stages are inductively coupled to outer filter stages 108A and 108B, and together form a balanced filter.

In some embodiments, as mentioned above, the ring of tunable inductive elements 110 comprises a ring of Josephson junctions. For example, as shown in FIG. 2B, a ring of Josephson junctions 203 may be positioned between the first inner stage 209A of the filter and the second inner stage 209B. In some cases, the ring of Josephson junctions can include an array of Josephson junctions. Indeed, in FIG. 3, each of the junctions b0, b1, b2, b3 may include an arrays of Josephson junctions, where each array includes two or more Josephson junctions. Using an array of Josephson junctions may allow a higher input current to be used, and may provide better power handling as each array provides an appropriate level of inductance for the mixer 101.

Regardless of whether Josephson junctions or arrays of Josephson junctions are used, the inductance of the ring of tunable inductive elements 110 is tunable by applying DC and/or IF currents to the ring of tunable inductive elements. The inductance may be tuned by applying the IF and/or DC control signals 103/104 signals through low-pass filters connected to the inductors 205A/205B that are mutually coupled to the inner stages 209A/209B of the filter 200. When either the DC or IF current is zero, the ring of Josephson junctions 203 is balanced and the transmission through the mixer 200 is zero. When the DC current applies a flux equal to the that applied by the IF current, the filter provides full transmission over the filter's pass band. If the IF current is equal and opposite the DC control signal value, then the filter also provides full transmission over the filter's pass band, but with a 180-degree phase shift.

In this manner, the ring of Josephson junctions allows inductive coupling between the first and second inner filter stages 209A/209B and the outer stages 208A/208B ranging from fully conductive in-phase, to non-conductive, to fully conductive out of phase (as depicted in the complex plane of FIG. 5). In some cases, as shown in FIG. 2C, IF and DC control signals may be applied through low-pass filters to directly or "galvanically" couple to the first and second inner filter stages. Thus, both inductance-coupled and galvanic-coupled embodiments are contemplated herein.

The tunable section of the filter 200 that includes the first and second inner stages 209A/209B is balanced and thereby forms a balanced modulator. This balancing allows the filter 200 to be turned on or off with an opposite sign (180 degree flipped) simply by reversing the polarity of the IF input control signal 201. The tunable inductive elements 110 allow for balanced modulation of the amplitude or the sign of the RF signal. This balanced modulator allows the incoming RF signal to be modulated and transmitted as a modulated RF output. The ring of tunable inductive elements in the superconducting mixer forms an inductive admittance inverter that couples the first and second inner filter stages 209A/209B. The IF and DC control signals are compatible with, and can be generated by, reciprocal quantum logic (RQL) circuits. Indeed, the modulation performed using the ring of Josephson junctions 203 may implemented by other instruments, devices, computing systems, software code or other entities that may use RQL or other superconducting logic. For instance, the balanced modulator of FIG. 2A may be used in a quantum computing scenario or other scenarios where superconductors are used.

In one specific embodiment, a filter is provided as shown in FIGS. 2A and 2B. The filter is a four-pole Chebychev filter with four inductors in the balanced filter section (i.e. first and second inner stages 209A and 209B). The admittance inverter between the inner stages of the filter is realized by the ring of tunable inductive elements 204 (i.e. Josephson junctions 203). This provides a tunable inductance for the Chebychev filter when DC current or IF currents are applied to the ring of tunable Josephson junctions. While shown as a Chebychev filter, the filter may be any pole filter or any type of filter. As such, circuit designers may use different filters for different situations, and thereby provide different filter characteristics.

The filter of FIG. 2A is a doubly balanced mixer using Josephson junctions as the switch elements between the first and second inner stages of the filter 200. The doubly balanced mixer provides 0 dB conversion loss when operated as a modulator, provides zero power dissipation, and provides a modulating signal compatible with superconducting technologies such as RQL. In one specific example, the doubly balanced superconducting mixer 101 includes the following: an input port 105 configured to receive as an input an RF signal 102, an IF control signal 103, a DC control signal 104, a band-pass filter 107 that includes a first inner filter stage 109A and a second inner filter stage 109B, coupled via a ring of tunable Josephson junctions 203 that are inductively coupled to the first and second inner filter stage, where the first and second inner filter stages are also inductively coupled to multiple outer filter stages 108A/108B, where the first and second inner filter stages form a balanced band-pass filter section, and a controller 106 that modulates the RF signal 102 using the IF control signal 103 and the DC control signal 104 to tune the ring of Josephson junctions 203 to control transmission of the RF signal through the band-pass filter 107.

In some cases, in order to ensure that the Josephson inductance behaves as expected, the doubly balanced superconducting mixer 101 keeps the ratio of the unbiased Josephson inductance to the loop inductance of the balanced filter section (comprising inner stages 209A/209B) less than one. The inductance of the Josephson junctions or arrays of Josephson junctions may be tuned by applying DC or IF currents to the loop inductors 205A/205B of the second inner stage 209B. The tuning of the Josephson junctions' inductance allows modulation of the RF input signal 102. It also allows demodulation of a modulated signal.

Figure 6:
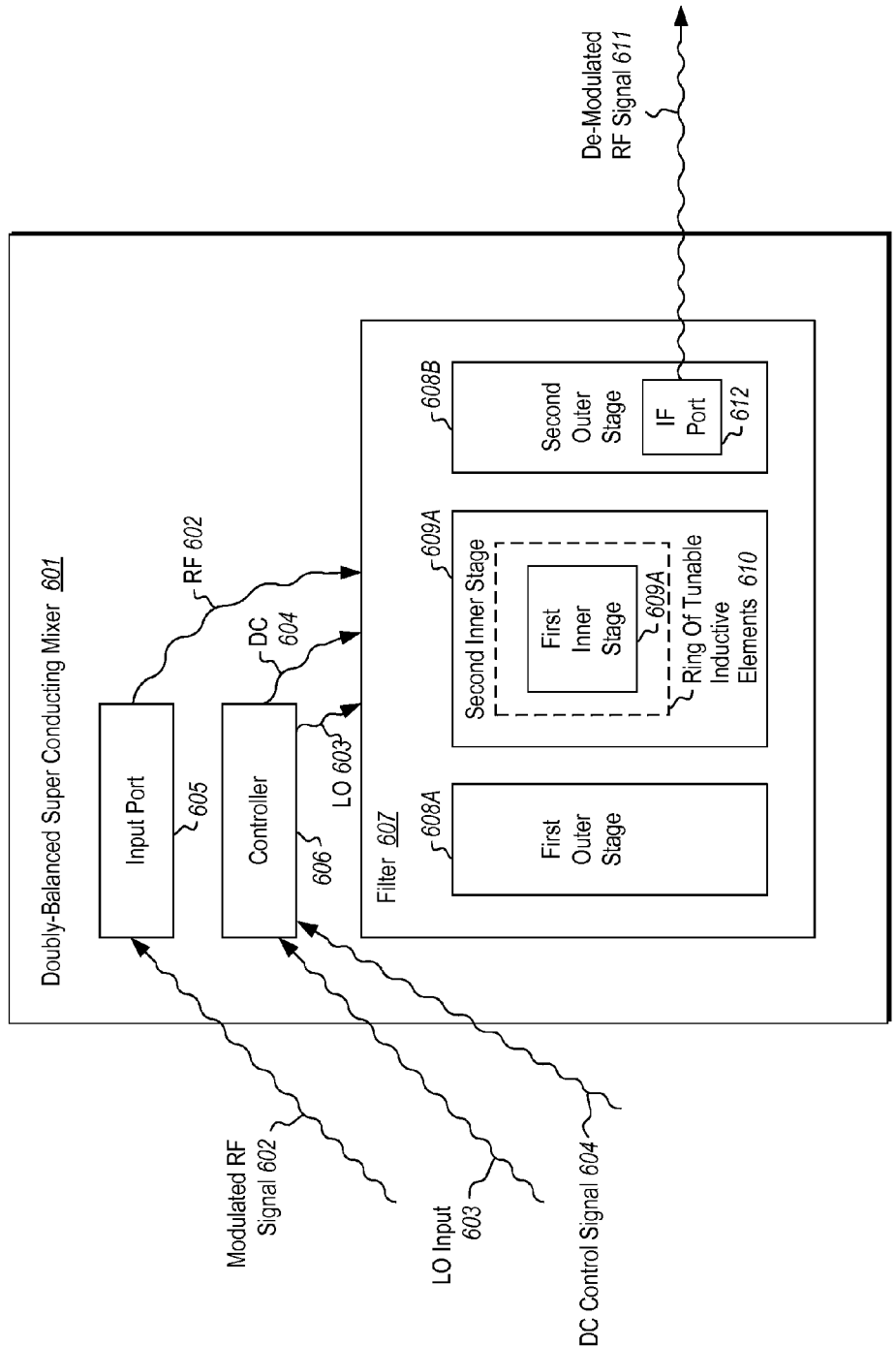
FIG. 6 illustrates an embodiment of a doubly balanced superconducting mixer configured for de-modulation.

As shown in FIG. 6, a doubly balanced superconducting mixer 601 may be provided which is substantially the same as the mixer 101 of FIG. 1. The mixer 601 may include an input port 605 that receives RF signal input 602, except that in this case, the input RF signal is already modulated in some manner (amplitude, frequency, phase, etc.). The doubly balanced superconducting mixer 601 may further include a controller 606 that controls DC control signal 604, and an LO input signal. The LO and DC control signals may control the tuning of the ring of tunable inductive elements 610. As above, the level of inductance of the tunable inductive elements 610 controls flow of the RF signal 602 between the first inner stage 609A of the filter 607 and the second inner stage 609B of the filter 607. The control signals may be used to control the ring of tunable inductive elements in such a manner the modulated RF signal 602 is demodulated. The output demodulated (baseband) signal 611 is outputted on the IF port 612 of the doubly balanced superconducting mixer 601.

The controller 606 of the doubly balanced superconducting mixer 601 may thus be used to demodulate a received modulated RF signal. The LO input signal 603 and the DC control signal 604 switch the ring of tunable Josephson junctions in a manner that rectifies the modulated RF signal 602 through the first and second inner filter stages of the filter 607, such that the demodulated signal appear at the IF port. As with the embodiments above in which the RF signal was modulated by the doubly balanced superconducting mixer 101, the filter may comprise any type of filter, and may include a variable number of poles, depending on circumstances and desired use. Still further, as with the embodiments above, the DC control signal 604 is a DC bias that adds to or cancels out flux applied by the LO input signal 603. When the resulting current is additive, the Josephson junction's impedance is high and no RF signal is transferred. When the resulting current is cancelled out, the impedance is low and the RF signal is transferred through the mixer's circuitry.

Thus, by tuning the inductance of Josephson junctions or other tunable inductive elements, the doubly balanced superconducting mixer 601 may receive, at the input port 605, a modulated RF signal 602 and demodulate the received modulated RF signal using the LO signal and the DC control signal 604 to tune the ring of tunable inductive elements 610 to rectify the RF signal through first and second inner filter stages 609A/609B of the filter 607. Demodulating the received RF signal 602 using the LO and DC control signals to tune the ring of tunable inductive elements 610 to rectify the RF signal at the frequency of the LO signal to provide a baseband signal to the IF port at the difference frequency between the LO and RF signals.

In some embodiments, the doubly balanced superconducting mixer 100 may be used to control microwave signals at cryogenic temperatures using the IF and DC control signals. As such, the doubly balanced superconducting mixer 101 may be used to control qubits in a quantum computer, or in another setting where superconductors or superconducting logic are used. The doubly balanced superconducting mixer 101 may provide microwave modulation capability with ultra-low power consumption, low conversion loss, and broad band operation.

Claim support: one embodiment includes a doubly balanced superconducting mixer 101. The mixer includes an input port 105 configured to receive as an input a radio frequency (RF) signal 102, an intermediate frequency (IF) control signal 103, a direct current (DC) control signal 104, a filter 107 that includes a first inner filter stage 109A and a second inner filter stage 109B, coupled via a ring of tunable inductive elements 110, the first and second inner filter stages being inductively coupled to a plurality of outer filter stages 108A/108B, forming a balanced filter, and a controller 106 configured to modulate the RF signal 102 using the IF control signal 103 and the DC control signal 104 to tune the ring of tunable inductive elements 110 to control transmission of the RF signal through the first and second inner filter stages.

In some cases, the ring of tunable inductive elements includes a plurality of Josephson junctions. Each of the plurality of Josephson junction includes an array of Josephson junctions. The controller is configured to provide an input signal on the IF port from a signal generator. The tunable inductive elements are configured to modulate the amplitude and/or the sign of the RF signal. The ring of tunable inductive elements that are inductively coupled to the first and second inner filter stages forms an inductive admittance inverter. The inductance of the ring of tunable inductive elements is tunable by applying DC or IF currents to the ring of tunable inductive elements.

In some cases, the filter includes a four-pole Chebychev filter with four inductors in the balanced filter section linked by the tunable inductive elements, providing a tunable inductance for the Chebychev filter when DC current or IF currents are applied the ring of tunable inductive elements. The ring of tunable inductive elements allows inductive coupling between the first and second inner filter stages and the plurality of outer stages ranging from fully conductive in-phase, to non-conductive, to fully conductive out of phase.

In another embodiment, a method is provided for modulating a radio frequency (RF) signal using a plurality of tunable inductive elements in a doubly balanced superconducting mixer 101. The method comprises the following: receiving, at an input port 105, an RF signal 102, receiving an intermediate frequency (IF) control signal 103, receiving a direct current (DC) control signal 104, and modulating the received RF signal 102 using the IF control signal 103 and the DC control 104 signal to switch a ring of tunable inductive elements 110 to allow or prevent transmission of the RF signal 102 through first and second inner filter stages 109A/109B of a filter 107, the filter including the ring of tunable inductive elements that are inductively coupled to the first inner filter stage 109A and the second inner filter stage 109B, the first and second inner filter stages being inductively coupled to a plurality of outer filter stages 108A/108B, the first and second inner filter stages forming a balanced filter section.

The method further includes controlling one or more microwave signals at a cryogenic temperature using the IF and DC control signals. The method further includes receiving, at the input port, a modulated RF signal, and demodulating the received modulated RF signal using an LO signal and the DC control signal to switch the ring of tunable inductive elements to rectify an RF signal through first and second inner filter stages of the filter. The method modulates the received RF signal using the IF control signal and the DC control signal to switch the ring of tunable inductive elements to allow or prevent transmission of the RF signal through first and second inner filter stages of the filter includes modulating at least one of the amplitude or the sign of the RF signal.

In another embodiment, a doubly balanced superconducting mixer 101 is provided. The mixer includes the following: an input port 105 configured to receive as an input a radio frequency (RF) signal 102, an intermediate frequency (IF) control signal 103, a direct current (DC) control signal 104, a band-pass filter 107 that includes a first inner filter stage 109A and a second inner filter stage 109B, coupled via a ring of Josephson junctions 110, the first and second inner filter stages being inductively coupled to a plurality of outer filter stages 108A/108B, forming a balanced band-pass filter, and a controller 106 configured to modulate the RF signal 102 using the IF control signal 103 and the DC control signal 104 to switch the ring of tunable Josephson junctions to allow or prevent transmission of the RF signal 102 through the first and second inner filter stages of the band-pass filter. The controller is configured to demodulate a received modulated RF signal using an LO signal and the DC control signal to switch the ring of tunable Josephson junctions to rectify the RF signal through the band-pass filter.

In this manner, a doubly balanced superconducting mixer is provided which can perform signal processing in superconducting microwave circuits. Such a doubly balanced, superconducting mixer may have little to no dissipation, and may be applied in many different scenarios including quantum computing (specifically in qubit control and readout), in analog front-end for digital receivers that use reciprocal quantum logic (RQL), and other microwave superconducting applications such as detectors for astronomy research and satellite communications.

The concepts and features described herein may be embodied in other specific forms without departing from their spirit or descriptive characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

We claim:

1. A doubly balanced superconducting mixer, comprising:
   an input port configured to receive as an input a radio frequency (RF) signal;
   an intermediate frequency (IF) control signal;
   a direct current (DC) control signal;
   a filter that includes a first inner filter stage and a second inner filter stage, coupled via a ring of tunable inductive elements, the first and second inner filter stages being inductively coupled to a plurality of outer filter stages, forming a balanced filter; and
   a controller configured to modulate the RF signal using the IF control signal and the DC control signal to tune the ring of tunable inductive elements to control transmission of the RF signal through the first and second inner filter stages.

2. The doubly balanced superconducting mixer of claim 1, wherein the ring of tunable inductive elements comprises a plurality of Josephson junctions.

3. The doubly balanced superconducting mixer of claim 2, wherein each of the plurality of Josephson junction comprises an array of Josephson junctions.

4. The doubly balanced superconducting mixer of claim 1, wherein the controller is configured to provide an input signal on the IF port from a signal generator.

5. The doubly balanced superconducting mixer of claim 1, wherein the tunable inductive elements are configured to modulate at least one of the amplitude or the sign of the RF signal.

6. The doubly balanced superconducting mixer of claim 1, wherein the ring of tunable inductive elements that are inductively coupled to the first and second inner filter stages forms an inductive admittance inverter.

7. The doubly balanced superconducting mixer of claim 1, wherein the inductance of the ring of tunable inductive elements is tunable by applying DC or IF currents to the ring of tunable inductive elements.

8. The doubly balanced superconducting mixer of claim 1, wherein the filter comprises a four-pole Chebychev filter with four inductors in the balanced filter section linked by the tunable inductive elements, providing a tunable inductance for the Chebychev filter when DC current or IF currents are applied the ring of tunable inductive elements.

9. The doubly balanced superconducting mixer of claim 1, wherein the ring of tunable inductive elements allows inductive coupling between the first and second inner filter stages and the plurality of outer stages ranging from fully conductive in-phase, to non-conductive, to fully conductive out of phase.

10. The doubly balanced superconducting mixer of claim 1, wherein the IF and DC control signals are compatible with or are implemented with single flux quantum logic.

11. A method for modulating a radio frequency (RF) signal using a plurality of tunable inductive elements in a doubly balanced superconducting mixer, the method comprising the following:
receiving, at an input port, an RF signal;
receiving an intermediate frequency (IF) control signal;
receiving a direct current (DC) control signal; and
modulating the received RF signal using the IF control signal and the DC control signal to switch a ring of tunable inductive elements to allow or prevent transmission of the RF signal through first and second inner filter stages of a filter, the filter including the ring of tunable inductive elements that are inductively coupled to the first inner filter stage and the second inner filter stage, the first and second inner filter stages being inductively coupled to a plurality of outer filter stages, the first and second inner filter stages forming a balanced filter section.

12. The method of claim 11, further comprising controlling one or more microwave signals at a cryogenic temperature using the IF and DC control signals.

13. The method of claim 11, further comprising:
receiving, at the input port, a modulated RF signal; and
demodulating the received modulated RF signal using an LO signal and the DC control signal to switch the ring of tunable inductive elements to rectify an RF signal through first and second inner filter stages of the filter.

14. The method of claim 11, wherein modulating the received RF signal using the IF control signal and the DC control signal to switch the ring of tunable inductive elements to allow or prevent transmission of the RF signal through first and second inner filter stages of the filter includes modulating at least one of the amplitude or the sign of the RF signal.

15. A doubly balanced superconducting mixer, comprising the following:
an input port configured to receive as an input a radio frequency (RF) signal;
an intermediate frequency (IF) control signal;
a direct current (DC) control signal;
a band-pass filter that includes a first inner filter stage and a second inner filter stage, coupled via a ring of Josephson junctions, the first and second inner filter stages being inductively coupled to a plurality of outer filter stages, forming a balanced band-pass filter; and
a controller configured to modulate the RF signal using the IF control signal and the DC control signal to switch the ring of tunable Josephson junctions to allow or prevent transmission of the RF signal through the first and second inner filter stages of the band-pass filter.

16. The doubly balanced superconducting mixer of claim 15, wherein the ring of tunable Josephson junctions comprises a ring of Josephson junction arrays.

17. The doubly balanced superconducting mixer of claim 15, wherein the ratio of unbiased Josephson inductance to loop inductance of the balanced band-pass filter is less than one.

18. The doubly balanced superconducting mixer of claim 15, wherein the controller is configured to demodulate a received modulated RF signal using an LO signal and the DC control signal to switch the ring of tunable Josephson junctions to rectify the RF signal through the band-pass filter.

19. The doubly balanced superconducting mixer of claim 15, wherein the IF and DC signals are applied through low-pass filters to the outer filter stages which are inductively coupled to the first and second inner filter stages.

20. The doubly balanced superconducting mixer of claim 15, wherein the IF and DC control signals are applied through low-pass filters to galvanically couple to the first and second inner filter stages.

* * * * *